(12) United States Patent  
Kasai et al.

(10) Patent No.: US 8,331,156 B2
(45) Date of Patent: Dec. 11, 2012

(54) NONVOLATILE SEMICONDUCTOR STORAGE DEVICE WITH MULTIPLE WELL REGIONS AND A SHARED BIT LINE

(75) Inventors: Takamichi Kasai, Yokohama (JP); Yoshiharu Hirata, Yokohama (JP); Kazuaki Isobe, Yokohama (JP); Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 12/882,232

(22) Filed: Sep. 15, 2010

(65) Prior Publication Data

US 2011/0205810 A1 Aug. 25, 2011

(30) Foreign Application Priority Data

Feb. 19, 2010 (JP) .................................. 2010-035028

(51) Int. Cl.
*G11C 16/16* (2006.01)
*G11C 16/04* (2006.01)

(52) U.S. Cl. ......... 365/185.18; 365/185.13; 365/185.19; 365/185.33

(58) Field of Classification Search ............. 365/185.13, 365/185.18, 185.19
See application file for complete search history.

(56) References Cited

U.S. PATENT DOCUMENTS

| 6,243,292 B1* | 6/2001 | Kobayashi et al. ...... 365/185.13 |
| 7,215,576 B2 | 5/2007 | Watanabe et al. |
| 7,280,407 B2 | 10/2007 | Umezawa et al. |
| 7,817,474 B2* | 10/2010 | Shields et al. ........... 365/185.18 |
| 2009/0109760 A1* | 4/2009 | Nazarian et al. ......... 365/185.19 |
| 2009/0122600 A1* | 5/2009 | Choi et al. .................... 365/163 |

FOREIGN PATENT DOCUMENTS

JP 2001-043691 A 2/2001

OTHER PUBLICATIONS

Background Art Information Sheet provided by applicant (Jun. 26, 2010) (1 page total).

* cited by examiner

*Primary Examiner* — Hoai V Ho
*Assistant Examiner* — Tri Hoang
(74) *Attorney, Agent, or Firm* — Posz Law Group, PLC

(57) ABSTRACT

According to one embodiment, a nonvolatile semiconductor storage device includes a first well region of a first conductivity type, a second well region of the first conductivity type, a third well region of a second conductivity type, a bit line and a column decoder. A first cell array including a plurality of memory cells is formed in the first well region. A second cell array including a plurality of memory cells is formed in the second well region. The third well region includes the first and second well regions. The bit line is connected to the memory cells included in the first cell array and the memory cells included in the second cell array. The column decoder is connected to the bit line.

14 Claims, 12 Drawing Sheets

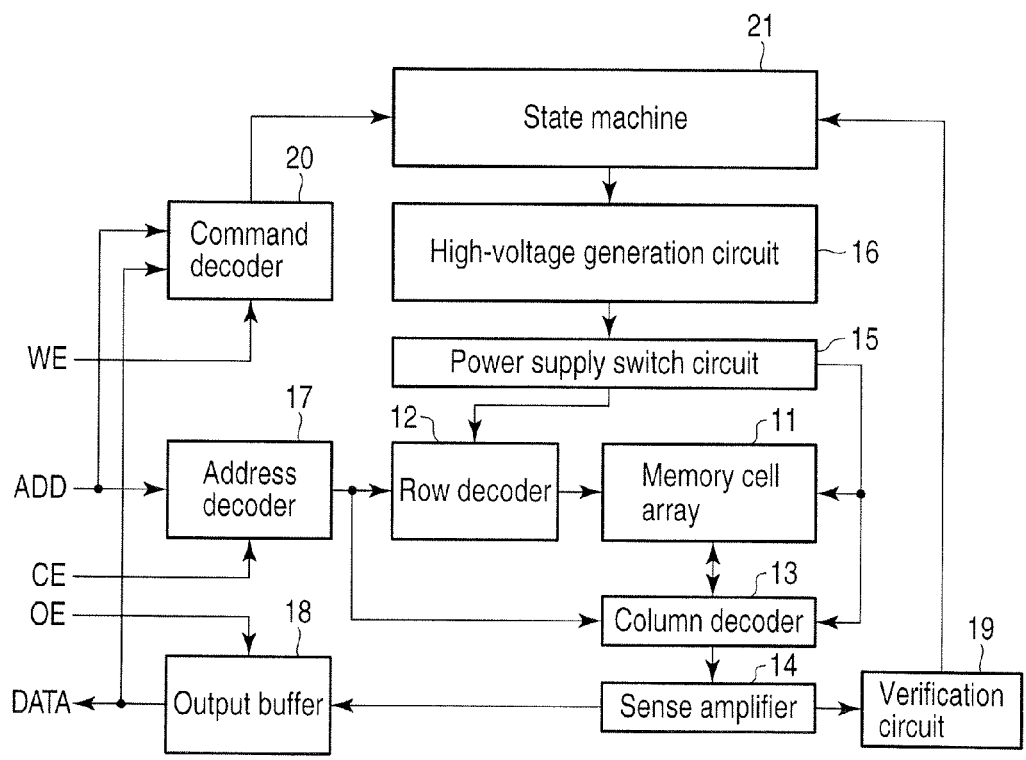
F I G. 1

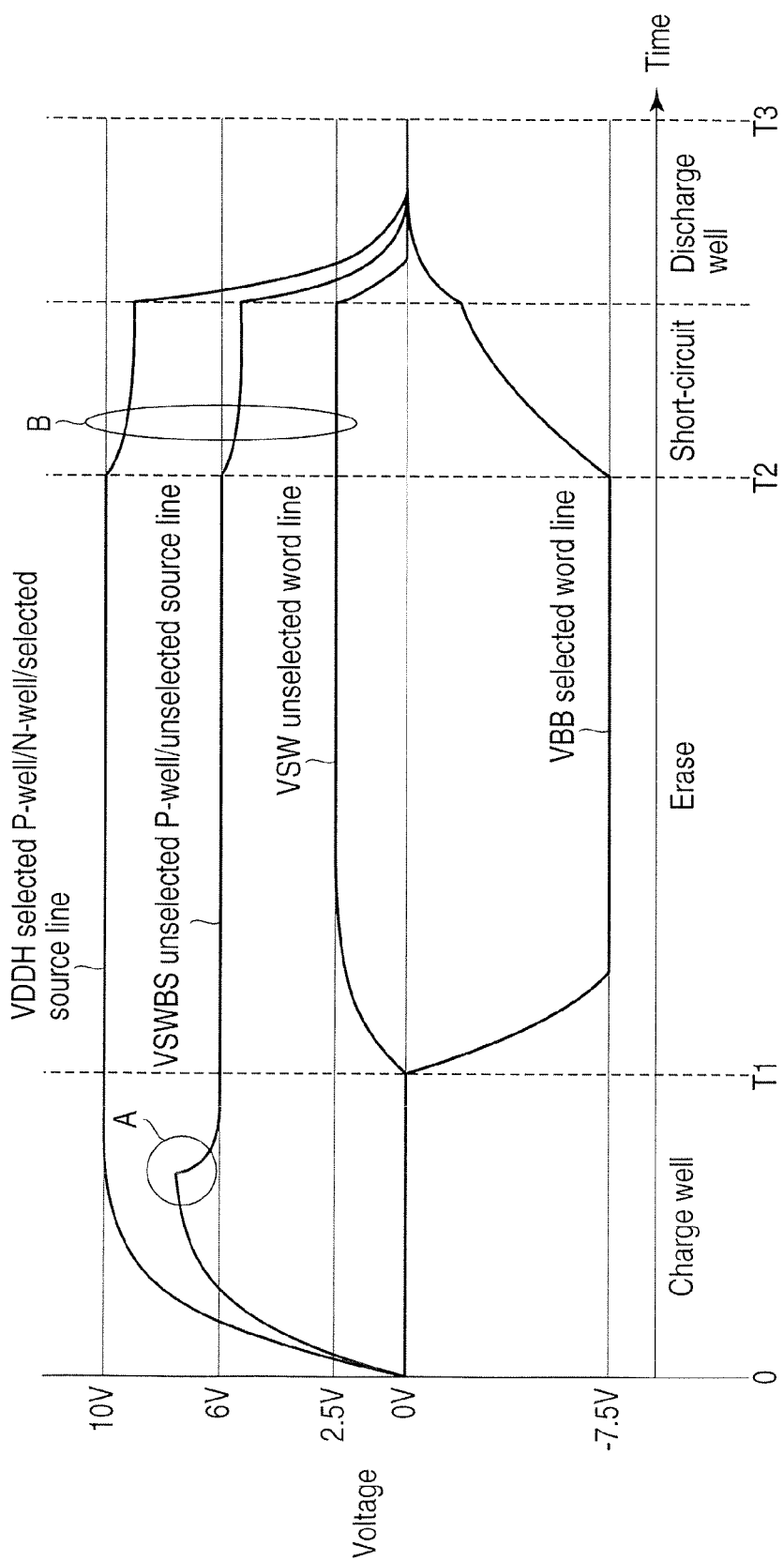
F I G. 7

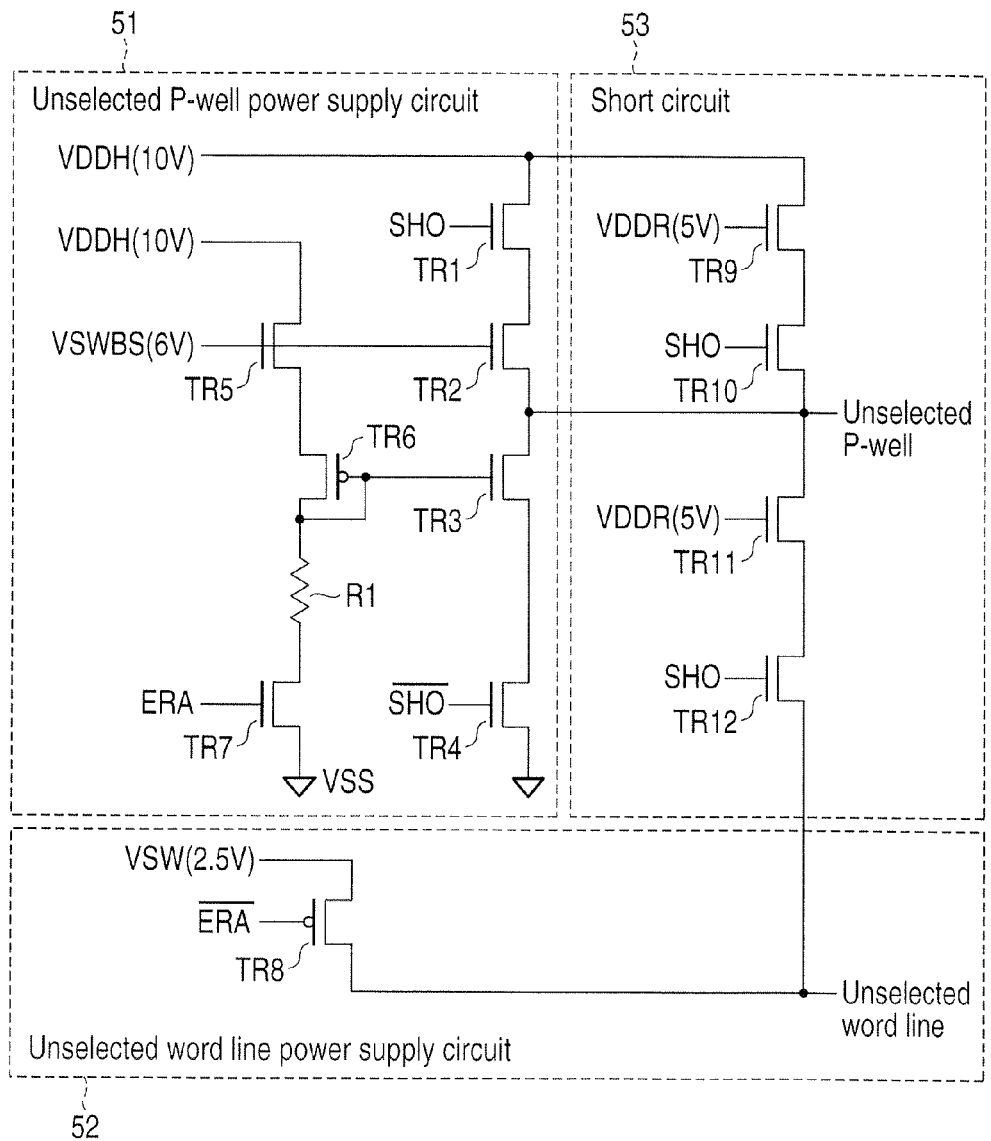
F I G. 9

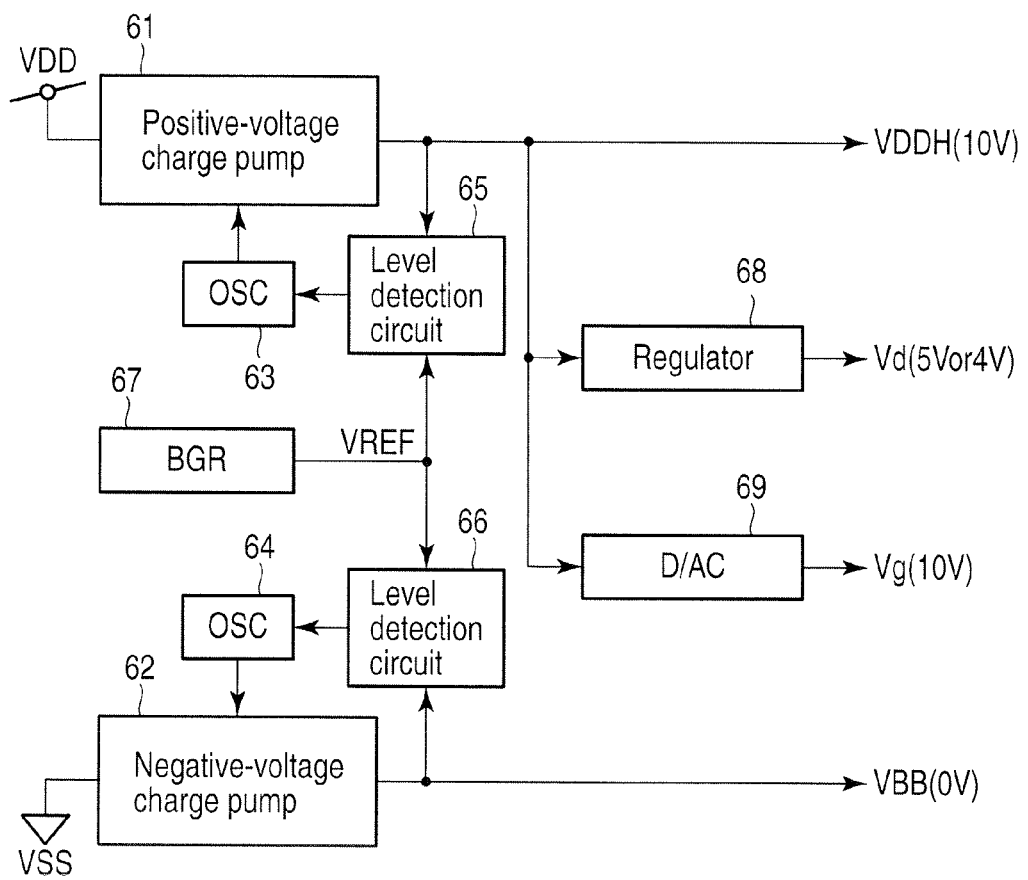
F I G. 16

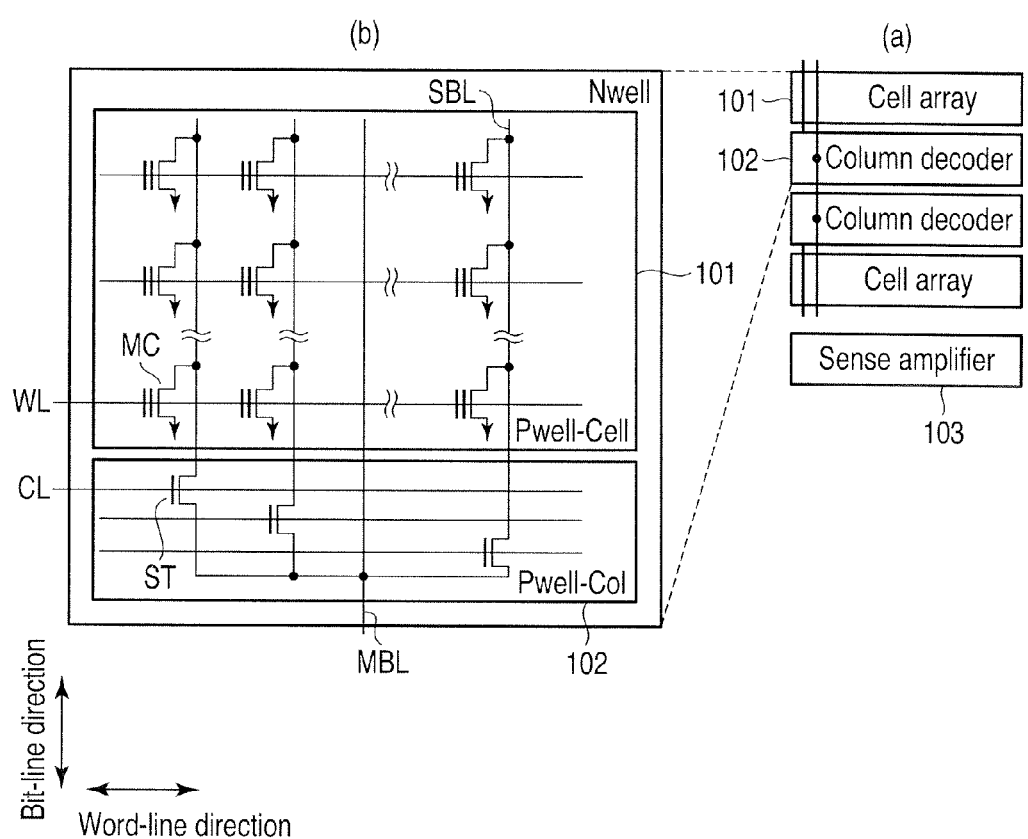
F I G. 17

NONVOLATILE SEMICONDUCTOR STORAGE DEVICE WITH MULTIPLE WELL REGIONS AND A SHARED BIT LINE

CROSS-REFERENCE TO RELATED APPLICATIONS

This application is based upon and claims the benefit of priority from Japanese Patent Application No. 2010-035028, filed Feb. 19, 2010; the entire contents of which are incorporated herein by reference.

FIELD

Embodiments described herein relate generally to a nonvolatile semiconductor storage device, for example, an electrically writable or erasable flash memory.

BACKGROUND

A NOR flash memory has heretofore been often used as an electrically writable or erasable flash memory. In the NOR flash memory, its storage capacity is increased, and writing/erasing is performed on a high-capacity basis.

In recent years, there has been a desire to perform writing/erasing on a low-capacity basis in such a NOR flash memory.

Accordingly, in some NOR flash memories, a well region is separated for each sector, and a decoder is independently provided for each sector, in order to minimize the effect of disturbance in writing/erasing (for example, see Jpn. Pat. Appln. KOKAI Publication No. 2001-43691).

However, in order to obtain a low-capacity sector, the number of separated well regions is increased, and a column decoder has to be provided for each of the increased well regions (sectors). This disadvantageously leads to an increased chip size.

BRIEF DESCRIPTION OF THE DRAWINGS

FIG. 1 is a block diagram showing the overall configuration of a nonvolatile semiconductor storage device according to embodiments;

FIG. 7 is a timing chart showing the erase operation in the first embodiment;

FIG. 9 is a circuit diagram of a charging/discharging switch circuit during the erase operation in the first embodiment;

FIG. 16 is a block diagram showing the configuration of a power supply circuit used during the write operation in the second embodiment; and FIG. 17 is a diagram showing the configuration of a nonvolatile semiconductor storage device according to another comparative example.

DETAILED DESCRIPTION

Figure 2:
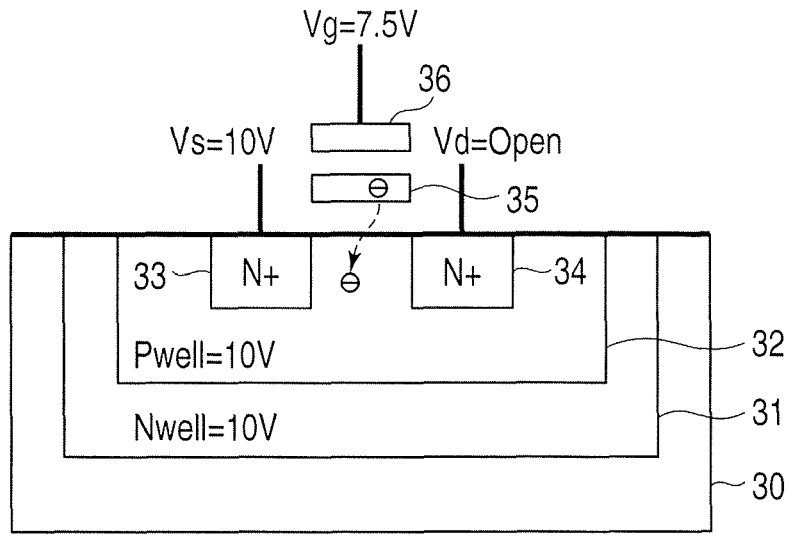
FIG. 2 is a sectional view of a memory cell showing an erase operation in a NOR flash memory.

A nonvolatile semiconductor storage device according to embodiments will be described hereinafter with reference to the drawings. Here, a NOR flash memory is shown as an example of the nonvolatile semiconductor storage device. In the explanation, like reference signs are assigned to like parts throughout the drawings.

In general, according to one embodiment, a nonvolatile semiconductor storage device includes a first well region of a first conductivity type, a second well region of the first conductivity type, a third well region of a second conductivity type, a bit line and a column decoder. A first cell array including a plurality of memory cells is formed in the first well region. A second cell array including a plurality of memory cells is formed in the second well region. The third well region includes the first and second well regions. The bit line is connected to the memory cells included in the first cell array and the memory cells included in the second cell array. The column decoder is connected to the bit line.

[1] Overall Configuration of Embodiments

First, the overall configuration of the nonvolatile semiconductor storage device according to the embodiments is described.

FIG. 1 is a block diagram showing the overall configuration of the nonvolatile semiconductor storage device according to the embodiments.

As shown, the nonvolatile semiconductor storage device comprises a memory cell array 11, a row decoder 12, a column decoder 13, a sense amplifier 14, a power supply switch circuit 15, a high-voltage generation circuit 16, an address decoder 17, an output buffer 18, a verification circuit 19, a command decoder 20 and a state machine (sequencer) 21.

The address decoder 17 receives an address ADD and a chip enable signal CE, and decodes the address ADD to output a decoded signal to the row decoder 12 and the column decoder 13.

The row decoder 12 selects a word line connected to a memory cell on the basis of the decoded signal. The column decoder 13 selects a bit line connected to the memory cell on the basis of the decoded signal.

The memory cell array 11 comprises a plurality of arrayed memory cells, and is provided with a plurality of cell arrays (well regions) in which a predetermined number of memory cells are formed.

The command decoder 20 receives the address ADD and a write enable signal WE, and decodes the address ADD and the write enable signal WE to output a command signal to the state machine 21. The state machine 21 controls the operation of each unit in the storage device in accordance with the command signal.

The high-voltage generation circuit 16 generates a voltage used in write and erase operations.

The sense amplifier 14 reads data from the memory cell selected by the decoders 12, 13. The output buffer 18 temporarily stores the data read by the sense amplifier 14, and externally outputs the data. The verification circuit 19 verifies the data read by the sense amplifier 14, and outputs the result of the verification to the state machine 21.

[2] Erase/Write Operations of NOR Flash Memory

An erase operation and a write operation of the NOR flash memory are described below.

Figure 3:
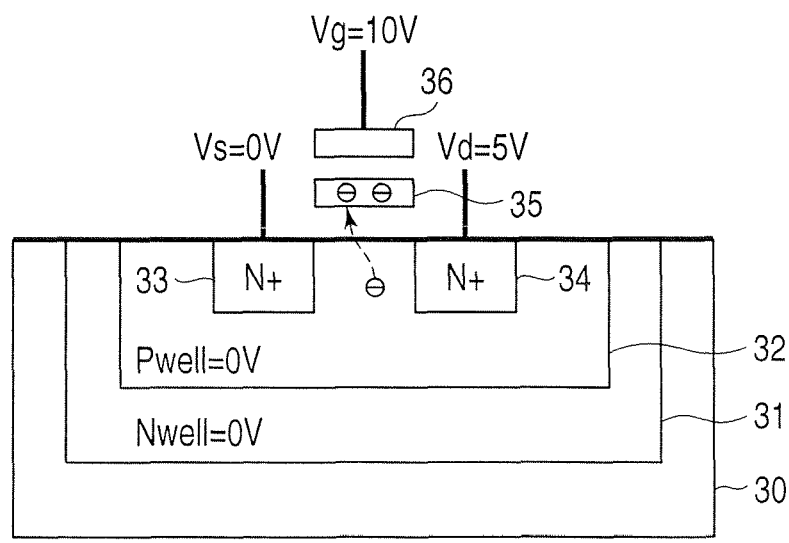
FIG. 3 is a sectional view of the memory cell showing a write operation in the NOR flash memory.
Figure 4:
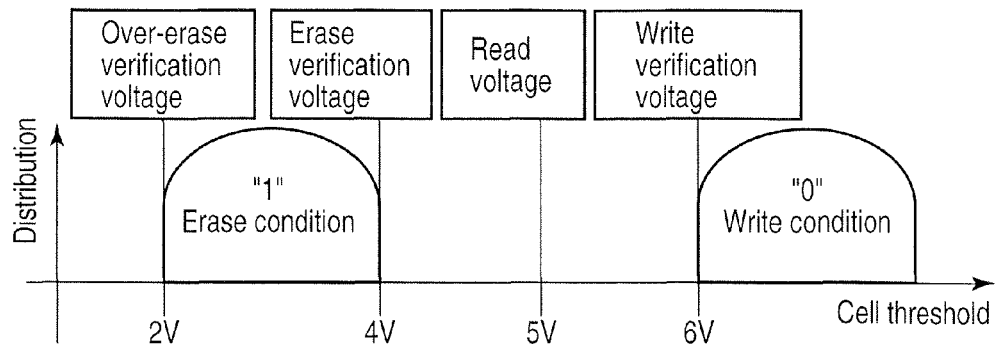
FIG. 4 is a diagram showing threshold distribution of the memory cell after the erase operation and write operation shown in FIG. 2 and FIG. 3.

FIG. 2 is a sectional view of the memory cell showing the erase operation in the NOR flash memory. FIG. 3 is a sectional view of the memory cell showing the write operation. FIG. 4 is a diagram showing threshold distribution of the memory cell after the erase operation and write operation.

First, referring to FIG. 2, the structure of the memory cells constituting the memory cell array 11 of the NOR flash memory is briefly described.

As shown in FIG. 2, an N-well region 31 is formed in a semiconductor substrate 30, and a P-well region 32 is formed on the N-well region 31. In the surface area of the P-well region 32, a source region (N+ region) 33 and a drain region (N+ region) 34 are arranged apart from each other.

A floating gate electrode 35 is formed above the P-well region 32 between the source region 33 and the drain region 34 via an unshown gate insulating film. A control gate electrode 36 is formed above the floating gate electrode 35 via an unshown gate insulating film. The memory cell comprises a cell transistor (nonvolatile memory cell) including the control gate electrode 36 and the floating gate electrode 35.

An example of the erase operation is described below with reference to FIG. 2.

As shown in FIG. 2, a voltage of 10 V is applied to the P-well region 32 and the N-well region 31 during the erase operation. A voltage of 10 V (source voltage Vs) is applied to the source region 33. A voltage of −7.5 V (gate voltage Vg) is applied to the control gate electrode 36. No voltage is applied to the drain region 34, and the drain region 34 is open. As a result, electrons accumulated in the floating gate electrode 35 escape to a channel region (P-well region 32) because of a Fowler-Nordheim (FN) tunneling current.

Now, an example of the write operation is described with reference to FIG. 3.

As shown in FIG. 3, a voltage of zero is applied to the P-well region 32 and the N-well region 31 during the write operation. A voltage of zero (source voltage Vs) is applied to the source region 33. A voltage of 10 V (gate voltage Vg) is applied to the control gate electrode 36. A voltage of 5 V (drain voltage Vd) is applied to the drain region 34. As a result, electrons are injected into the floating gate electrode 35 from the channel region.

After the end of the erase operation, the threshold of the memory cell is a voltage between an overerase verification voltage (e.g., 2 V) and an erase verification voltage (e.g., 4 V), as shown in FIG. 4. In contrast, the threshold of the memory cell is a voltage less than or equal to a write verification voltage after the write operation.

[3] First Embodiment

Now, the configuration and erase operation of the nonvolatile semiconductor storage device according to the first embodiment is described.

[3-1] Configuration of First Embodiment

Figure 5:
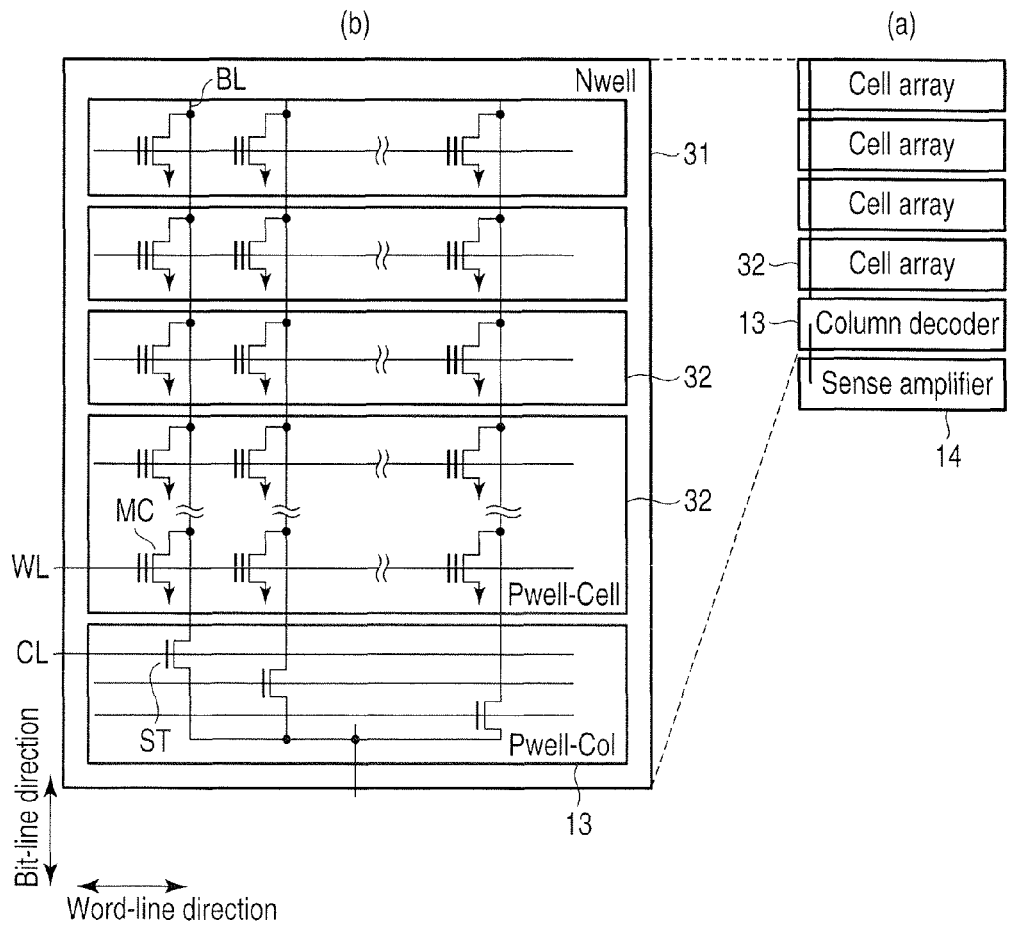
FIG. 5 is a diagram showing the configuration of a nonvolatile semiconductor storage device according to a first embodiment.

FIG. 5 is a diagram showing the configuration of a nonvolatile semiconductor storage device according to the first embodiment. Here, the memory cell array 11, the column decoder 13 and the sense amplifier 14 are shown, and other components are not shown. As the memory cell array 11, one N-well region including a plurality of cell arrays is shown.

As shown by (a) of FIG. 5, a plurality of cell arrays (P-well regions) 32 each having a plurality of memory cells are arranged in a bit-line direction. The cell array 32 has a predetermined low storage capacity of, for example, 4 KB. Adjacently to the cell array 32, the column decoder 13 is disposed. The sense amplifier 14 is located in the vicinity of the column decoder 13.

A circuit diagram of the cell arrays 32 and the column decoder 13 shown in (a) of FIG. 5 is shown in (b) of FIG. 5.

The N-well region 31 comprises a plurality of cell arrays 32 and the column decoder 13.

Each of the cell arrays 32 comprises a plurality of memory cells MC formed in the P-well regions 32, and a word line WL. The memory cells MC are arranged along the word-line direction, and the gate of each memory cell is connected to the word line WL. Across the cell arrays 32, a bit line BL is connected to the drain of each of the memory cells in the cell arrays 32 arranged in the bit-line direction.

The column decoder 13 is provided for each N-well region 31 having a plurality of cell arrays 32. The column decoder 13 comprises a plurality of select transistors ST, and a column select line CL connected to the gates of the select transistors ST. The bit line BL is connected to the drains of the select transistors ST. The column select line CL is connected to the gates of the select transistors ST. The column select line CL controls the connection of the bit line BL to the sense amplifier 14.

As shown by (b) of FIG. 5, the cell arrays are formed in the divided well regions 32. That is, one cell array is formed in one well region 32, and a plurality of cell arrays (P-well regions) 32 are formed in one N-well region 31.

[3-2] Operation of First Embodiment

Measures for disturbance newly caused to the erase operation in the nonvolatile semiconductor storage device according to the first embodiment and the conventional example are described.

Figure 6:
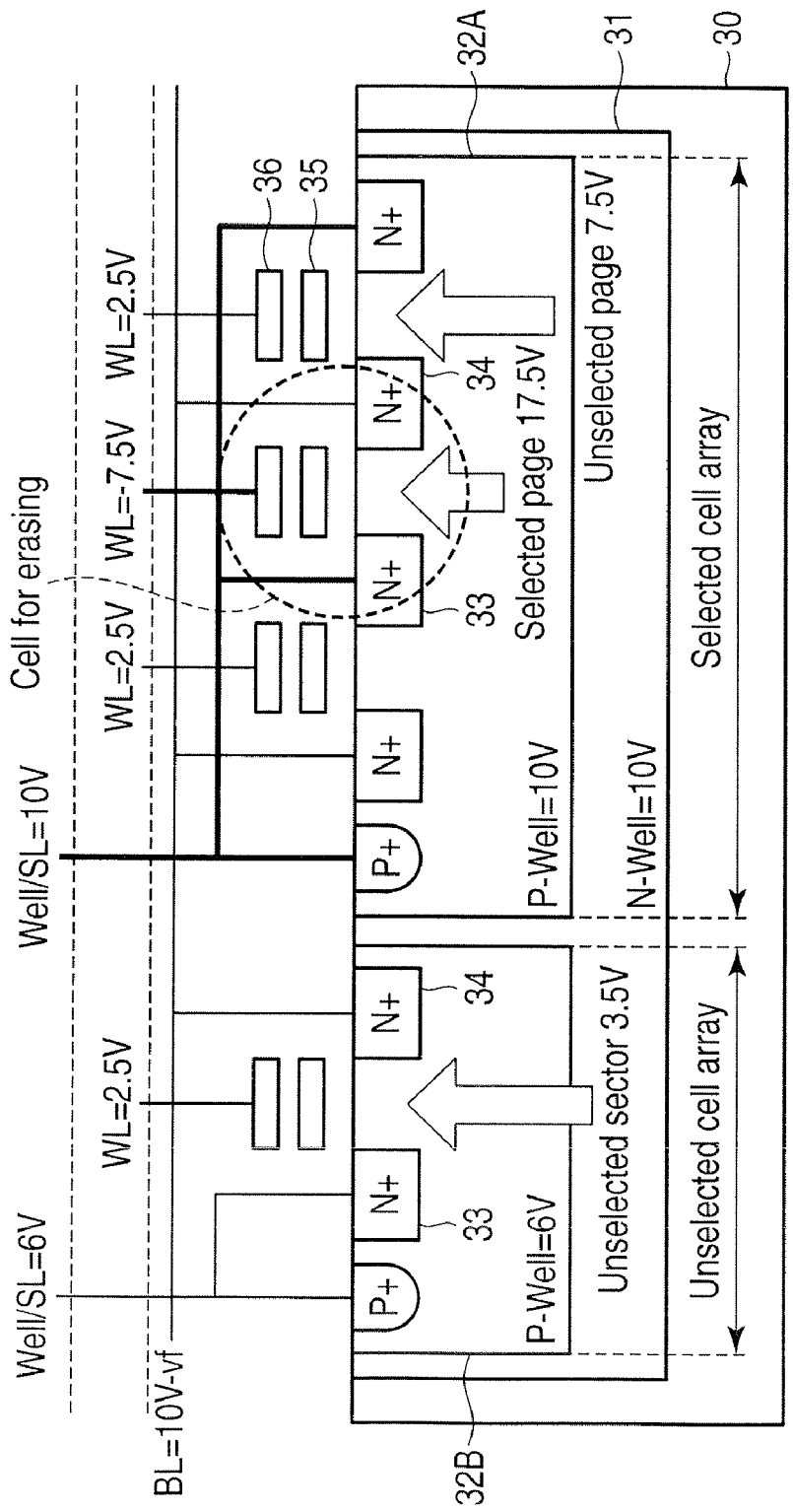
FIG. 6 is a sectional view showing a bias condition during the erase operation in the nonvolatile semiconductor storage device according to the first embodiment.

FIG. 6 is a sectional view showing a bias condition during the erase operation in the nonvolatile semiconductor storage device according to the first embodiment. A P-well region 32A which includes a memory cell targeted for erasing is referred to as a selected P-well region (selected cell array), and a P-well region 32B which does not include any memory cell targeted for erasing is referred to as an unselected P-well region (unselected cell array).

First, the N-well region 31 shared by the selected P-well region 32A and the unselected P-well region 32B, and the selected P-well region 32A are charged up to, for example, 10 V. In this case, since the bit line BL is shared by the selected P-well region 32A and the unselected P-well region 32B, 10 V−Vf is applied to the bit line BL via a PN junction of the selected P-well region 32A. Here, Vf represents a forward falling voltage in a PN diode.

For example, as heretofore, if the voltage of the unselected P-well region is zero, there is a problem of a withstand voltage (drain withstand voltage) across the drain region 34 in the unselected P-well region 32B and the P-well region 32B. Therefore, in the present embodiment, the unselected P-well region 32B is charged up to, for example, 6 V.

If the potential relationship of the well regions is (unselected P-well region 32B>N-well region 31), there is concern over a forward bias leading to a latch-up. Thus, the timing of charging the N-well region 31, the selected P-well region 32A and the unselected P-well region 32B should always correspond to the potential relationship (unselected P-well region 32B≦N-well region 31).

The erase operation is described in detail with reference to a timing chart shown in FIG. 7.

First, during a period between times 0 to T1, the selected P-well region 32A, the N-well region 31 and the unselected P-well region 32B are simultaneously charged so that the selected P-well region 32A and the N-well region 31 may reach, for example, 10 V (=voltage VDDH) and the unselected P-well region 32B may reach, for example, 6 V (=voltage SWBS). At the same time, a voltage of, for example, 10 V is applied to a source line SL. The selected P-well region 32A, the N-well region 31 and the unselected P-well region 32B are simultaneously charged here, but may otherwise be charged at different times. Moreover, at A in FIG. 7, a discharge path is provided to prevent an excessive rise of voltage VSWBS.

After the well regions have been charged, a selected word line connected to the control gate electrode 36 in the memory cell targeted for erasing is brought to, for example, a voltage of, for example, −7.5 V (=voltage VBB) at times T1 to T2. As a result, in a selected page including the memory cell connected to the selected word line, the selected P-well region 32A is at 10 V, and the selected word line is at −7.5 V, thus producing a potential difference of 17.5 V. Accordingly, an FN tunneling current through which electrons escape from the floating gate electrode 35 to the channel region is generated, thereby performing erasing.

In this case, the voltage of an unselected word line connected to the control gate electrode 36 in the memory cell which is not targeted for erasing suppresses a threshold variation attributed to erase disturbance caused in the selected P-well region 32A and attributed to erase disturbance/gate induced drain leakage (GIDL) caused in the unselected P-well region 32B. Therefore, a potential difference between the P-well regions 32A, 32B is preferably smaller. In the present embodiment, when the element withstand voltage of the row decoder is 10 V, a voltage of, for example, 2.5 V (=voltage VSW) is applied to the unselected word line.

As a result, in an unselected page including the memory cell connected to the unselected word line, the selected P-well region 32A is at 10 V, and the unselected word line is at 2.5 V, thus producing a potential difference of 7.5 V. However, this potential difference allows a small number of electrons to escape from the floating gate electrode 35 to the channel region, and is not a problem.

In contrast, in the unselected P-well region 32B, the unselected P-well region 32B is at 6 V, and the unselected word line is at 2.5 V, in an unselected page (unselected sector) including the memory cell connected to the unselected word line, thus producing a potential difference of 3.5 V. However, this potential difference allows a small number of electrons to escape from the floating gate electrode 35 to the channel region, and is not a problem.

After the end of erasing, the voltages of the well regions are discharged at times T2 to T3. In order to maintain a restriction similar to that for charging, that is, in order to maintain the potential relationship (unselected P-well region 32B≦N-well region 31), a short circuit is caused, via a transistor, between the selected P-well region 32A and the N-well region 31 (10 V), the unselected P-well region 32B (6 V), and the unselected word line (2.5 V). That is, at B in FIG. 7, if the voltage of the unselected P-well region 32B rises, the voltage of the unselected word line also rises, and a withstand voltage fault is caused. Thus, the voltage of the unselected P-well region 32B is clamped to cause a short circuit so that the voltage may not be more than 6V.

In the present embodiment, a transistor to which a voltage of 5 V (=voltage VDDR) is input at its gate is inserted to inhibit potential inversion due to coupling noise and discharge the voltages of the well regions 32A, 32B, 31 toward 0 V.

Consequently, problems caused by the sharing of the bit line among a plurality of P-well regions (cell arrays), including the drain withstand voltage, erase disturbance and GIDL, are solved.

Figure 8:
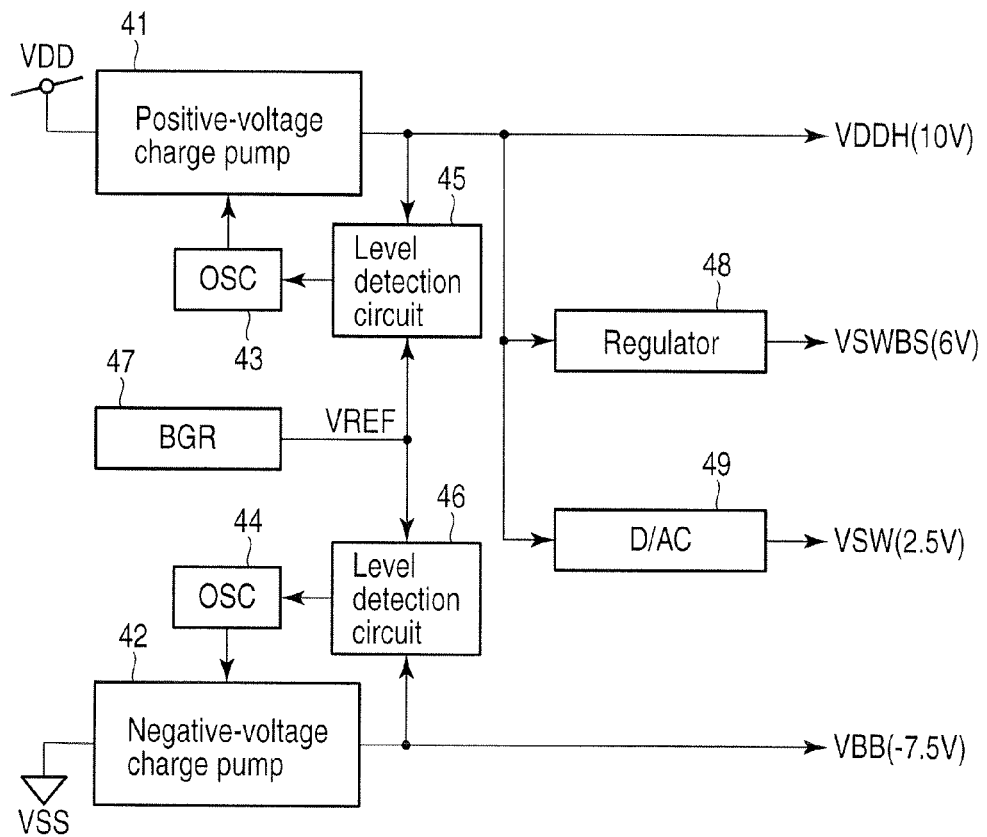
FIG. 8 is a block diagram showing the configuration of a power supply circuit used during the erase operation in the first embodiment.

FIG. 8 is a block diagram showing the configuration of a power supply circuit used during the erase operation described above.

As shown, the power supply circuit comprises a positive-voltage charge pump 41, a negative-voltage charge pump 42, oscillators (OSC) 43, 44, level detection circuits 45, 46, a band-gap reference (BGR) circuit 47, a regulator 48 and a digital-to-analog converter (D/AC) 49.

The positive-voltage charge pump 41 uses the level detection circuit 45 and the oscillator 43 to generate voltage VDDH (10 V) for charging the N-well region 31 and the selected P-well region 32A. The regulator 48 adjusts voltage VDDH to output voltage VSWBS for charging the unselected P-well region 32B.

The digital-to-analog converter 49 is a circuit for converting a digital code into an analog voltage, and uses voltage VDDH to output voltage VSW (2.5 V) to be supplied to the unselected word line. The negative-voltage charge pump 42 uses the level detection circuit 46 and the oscillator 44 to generate voltage VBB (−7.5 V) to be supplied to the selected word line.

Now, a charging/discharging switch circuit for charging/discharging the selected P-well region 32A, the unselected P-well region 32B and the N-well region 31 in the erase operation is described.

FIG. 9 is a circuit diagram of the charging/discharging switch circuit for the well regions during the erase operation.

As shown, the charging/discharging switch circuit comprises an unselected P-well power supply circuit 51, an unselected word line power supply circuit 52 and a short circuit 53.

The unselected P-well power supply circuit 51 comprises MOS field effect transistors (hereinafter referred to as MOS transistors) TR1, TR2, . . . , TR7, and a resistance R1. The unselected word line power supply circuit 52 comprises a MOS transistor TR8. The short circuit 53 comprises MOS transistors TR9, TR10, . . . , TR12.

MOS transistors TR1, TR5 and TR9 are supplied at one end with voltage VDDH. The gates of MOS transistors TR5 and TR2 are supplied with voltage VSWBS. The gates of MOS transistors TR9 and TR11 are supplied with voltage VDDR.

An erase signal ERA is input to the gate of MOS transistor TR7, and an erase signal /ERA which is a negated signal of the erase signal ERA is input to the gate of MOS transistor TR8. Note that a prefixed slash symbol indicates a negated signal.

A short signal SHO is input to the gates of MOS transistors TR1, TR10 and TR12, and a short signal /SHO which is an inversion signal of the short signal SHO is input to the gate of MOS transistor TR4.

MOS transistors TR4 and TR7 are supplied at one end with a reference voltage, for example, a ground potential Vss.

In the circuit shown in FIG. 9, the erase signals ERA, /ERA are input during charging in the erase operation, and the short signals SHO, /SHO are input during discharging.

In the first embodiment, the memory cell array is divided in the P-well region 32 alone, and a plurality of P-well regions 32 are formed in the N-well region 31. That is, the N-well region 31 is shared by a plurality of P-well regions 32. Thus, the erase operation can be performed using a small storage capacity unit, and the time of erasing can be reduced. As the erase operation can be performed using the small storage capacity unit, disturbance in the erase operation can be more suppressed than when the erase operation is performed using a great storage capacity unit.

Moreover, the common bit line is connected to the memory cells in a plurality of cell arrays. The bit line is thus shared among a plurality of cell arrays separated in the well region, so that the number of necessary column decoders can be reduced. This enables the inhibition of a chip size increase. Moreover, there is no need for a structure having a main bit line and a sub-bit line connected to the main bit line, that is, a double bit-line structure, thereby allowing the reduction of wiring layers.

[4] Second Embodiment

Now, a nonvolatile semiconductor storage device according to the second embodiment is described. A common bit line is used among a plurality of cell arrays in the first embodiment described above. That is, the bit line needs no double structure, and a plurality of cell arrays can be arranged for the same bit line. In contrast, disturbance during writing aggravates in such a structure. Thus, in the second embodiment, means for stepping up the voltage applied to the drain region during the write operation is used as means for inhibiting the disturbance during writing.

Before describing the second embodiment, a write operation in a comparative example is described for the second embodiment to be understood more easily.

Figure 10:
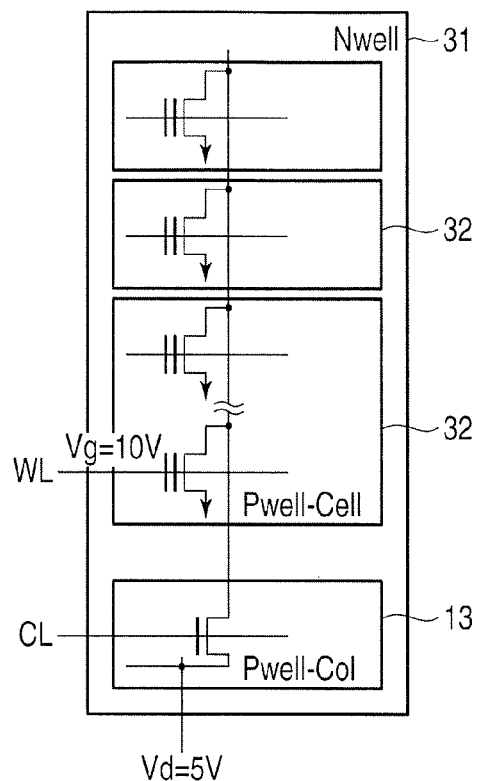
FIG. 10 is a circuit diagram showing the configuration of a nonvolatile semiconductor storage device as a comparative example.
Figure 11:
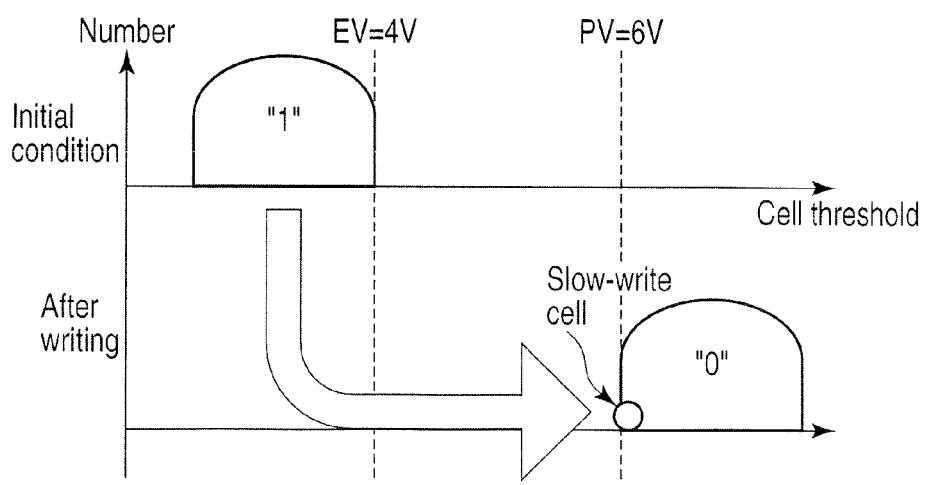
FIG. 11 is a graph showing threshold distribution of a memory cell before and after writing in the comparative example.

FIG. 10 is a circuit diagram showing the configuration of a nonvolatile semiconductor storage device as a comparative example. FIG. 11 is a graph showing threshold distribution of a memory cell before writing (initial condition) and after writing.

In the control during the write operation in the comparative example, attention is focused on a memory cell having a slow write characteristic, and the gate voltage Vg, the drain voltage Vd and a write pulse tPW which are applied during writing are determined in accordance with the memory cell having the slow write characteristic, in order to reduce the write time.

For example, suppose that 512 memory cells are connected to one bit line. Then, the write operation for all of the 512 memory cells is finished by one write under write conditions Vg=10 V, Vd=5 V and tPW=1 µs, as shown in FIG. 11. In this case, if 100 K writes are performed for the 512 memory cells, stress of the drain region can be represented by drain voltage Vd=5 V, 51 S. Here, 100 K is the number of possible writes generally required in the market.

[4-1] Configuration of Second Embodiment

Figure 12:
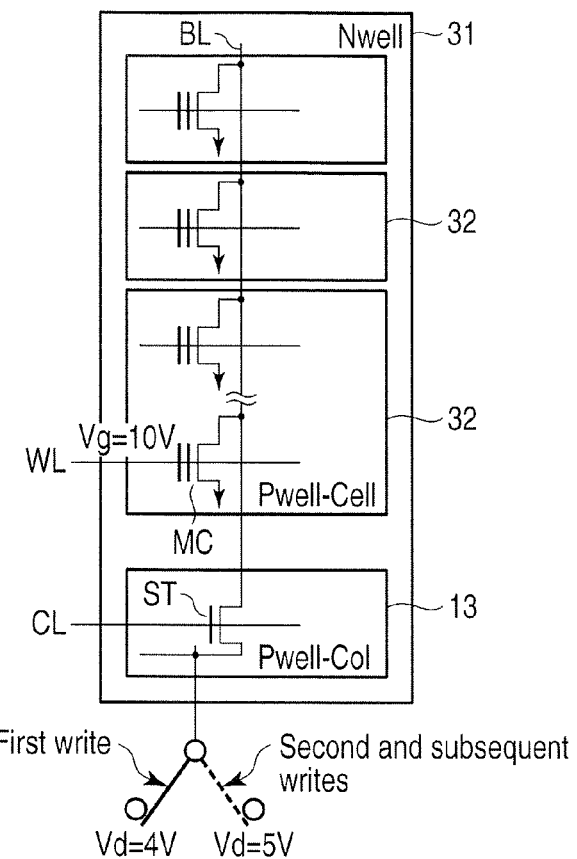
FIG. 12 is a circuit diagram showing the configuration of a nonvolatile semiconductor storage device according to a second embodiment.

FIG. 12 is a circuit diagram showing the configuration of the nonvolatile semiconductor storage device according to the second embodiment. In the second embodiment, the memory cell array 11, the column decoder 13 and the sense amplifier 14 are similar in configuration to those in the first embodiment, and FIG. 12 is therefore shown in a simplified form. Here again, for example, 512 memory cells are connected to one bit line.

[4-2] Operation of Second Embodiment

Figure 13:
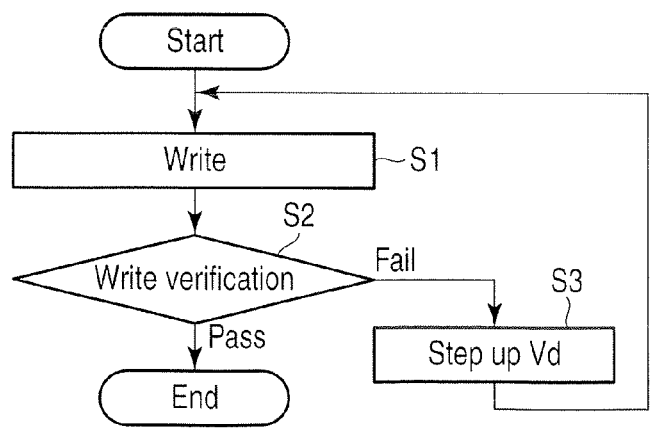
FIG. 13 is a flowchart showing a write operation in the second embodiment.
Figure 14:
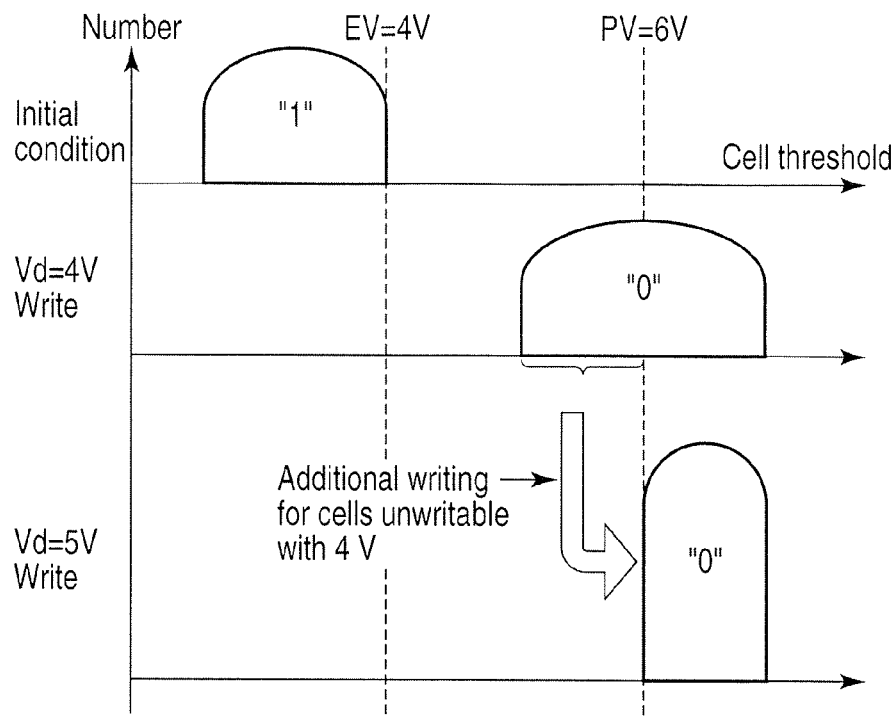
FIG. 14 is a graph showing threshold distribution of a memory cell before and after writing in the second embodiment.

FIG. 13 is a flowchart showing a write operation in the second embodiment. FIG. 14 is a graph showing threshold distribution of the memory cell before writing (initial condition) and after writing.

As shown in FIG. 13, in order to ease disturbance during writing, writing is first performed on the memory cell with a low drain voltage Vd of, for example, 4 V (first write voltage) (step S1).

Furthermore, a write verification is conducted for the memory cell (step S2). In this case, writing is performed on memory cells having a rapid write characteristic up to a threshold greater than or equal to a write verification voltage PV, so that the writing to these memory cells is finished. In contrast, the thresholds of memory cells having a slow write characteristic are lower than the write verification voltage PV. Therefore, writing is again performed on these memory cells with a drain voltage Vd, for example, 5 V (second write voltage), which is higher than the first write voltage (step S3). That is, for those memory cells only to which nothing has been written with a drain voltage Vd of 4 V, writing is again performed with a higher voltage of 5 V. Thus, writing is again performed on the memory cells having the slow write characteristic.

The stress of the drain region in this case is calculated at (Vd=4 V, 51 s)+(Vd=5 V, 25 s).

Figure 15:
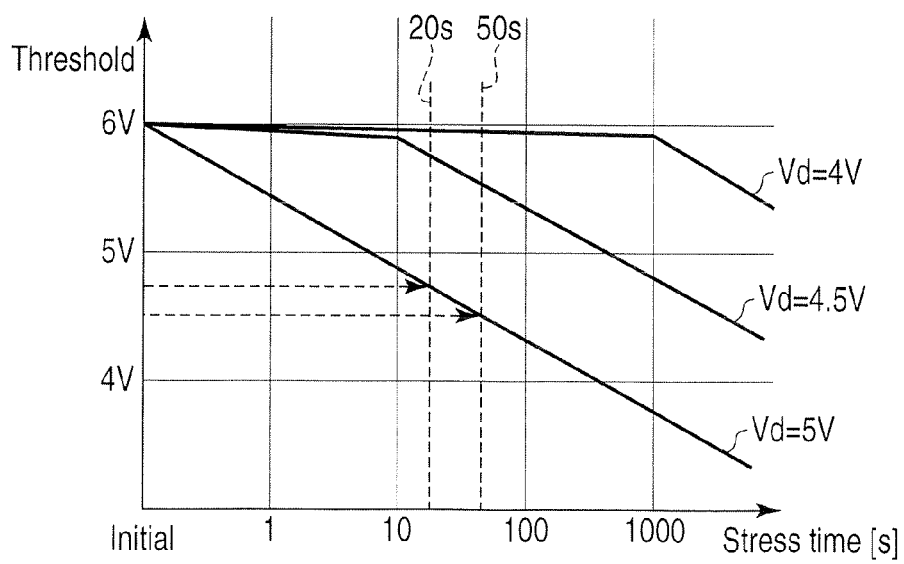
FIG. 15 is a graph wherein a threshold variation is caused by stress of a drain region during a write operation in the second embodiment.

FIG. 15 is a graph wherein a threshold variation is caused by the stress of the drain region during the above-mentioned write operation.

In the comparative example, the stress of the drain region is Vd=5 V, 51 s, and the threshold variation is about 1.5 V. In contrast, in the second embodiment, the stress of the drain region is (Vd=4 V, 51 s)+(Vd=5 V, 25 s), and the threshold variation is about 1.3 V, so that the threshold variation can be improved (reduced). The threshold variation caused by disturbance can be suppressed. There is a greater advantage in the case of a great variation of write characteristics in the memory cell.

In contrast, the time of writing to the memory cell increases about 1.5 times, but the time necessary for a voltage rise (10 V) in the word line is predominant because of the decreased voltage of an external power supply. Therefore, the increase of the above-mentioned write time in the overall time for the write operation is small and makes little difference.

FIG. 16 is a block diagram showing the configuration of a power supply circuit used during the write operation described above.

As shown, the power supply circuit comprises a positive-voltage charge pump 61, a negative-voltage charge pump 62, oscillators (OSC) 63, 64, level detection circuits 65, 66, a band-gap reference (BGR) circuit 67, a regulator 68 and a digital-to-analog converter (D/AC) 69.

The positive-voltage charge pump 61 uses the level detection circuit 65 and the oscillator 63 to generate a voltage VDDH (10 V). The regulator 68 adjusts voltage VDDH to output a drain voltage Vd (4 or 5 V) for charging the drain region of the selected memory cell.

The digital-to-analog converter 69 is a circuit for converting a digital code into an analog voltage, and uses voltage VDDH to output a gate voltage Vg (10 V) to be supplied to an selected word line. The negative-voltage charge pump 62 uses the level detection circuit 66 and the oscillator 64 to generate a voltage VBB (0 V).

In the second embodiment, the drain voltage applied to the drain region of the memory cell is gradually increased to perform a plurality of writes. Thus, the stress of the drain region can be reduced, and disturbance during writing can therefore be inhibited. Moreover, as in the first embodiment, the bit line is shared among a plurality of cell arrays separated in the well region so that the number of necessary column decoders can be reduced. This enables the inhibition of a chip size increase. Regarding other advantages, the second embodiment is similar to the first embodiment.

[5] Comparative Example

A nonvolatile semiconductor storage device as a comparative example is described with reference to FIG. 17 to compare with the nonvolatile semiconductor storage device according to the embodiments described above. In this explanation, parts similar to those in the above embodiments are not described in detail.

[5-1] Configuration of Comparative Example

FIG. 17 is a diagram showing the configuration of the nonvolatile semiconductor storage device according to the comparative example.

As shown by (a) of FIG. 17, a plurality of cell arrays 101 each having a plurality of memory cells are arranged in a bit-line direction. The cell array 101 has a storage capacity of, for example, 4 KB. Adjacently to one cell array 101, one column decoder 102 is disposed. A sense amplifier 103 is located in the vicinity of the column decoder 102.

A circuit diagram of the cell arrays 101 and the column decoder 102 shown in (a) of FIG. 17 is shown in (b) of FIG. 17. The cell array 101 comprises a plurality of memory cells MC, a word line WL, a plurality of sub-bit lines SBL and a main bit line MBL. The word line WL is connected to the gates of the memory cells MC arranged in a word-line direction, and the sub-bit lines SBL are connected to the drains of the memory cells MC arranged in a bit-line direction.

In the column decoder 102, the sub-bit line SBL is connected to the main bit line MBL via a select transistor ST.

The flash memory shown as the comparative example requires a higher capacity, and also requires, for use in mobile telephones, a shorter rewrite time, rewriting on a low-capacity basis, and a guaranteed number of rewrites. In order to meet these requirements, the memory cell array has to be divided into smaller parts. However, when the memory cell array is divided into smaller parts, there arises a problem of a chip size increase.

As described above, according to the first and second embodiments, it is possible to provide a nonvolatile semiconductor storage device in which a threshold variation caused by disturbance in writing or erasing is inhibited and in which the increase in area is suppressed.

Although the NOR flash memory is described as an example of the nonvolatile semiconductor storage device in the above embodiments, the embodiments are not limited thereto and are also applicable to other nonvolatile semiconductor storage devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
   a first well region of a first conductivity type in which a first cell array including a plurality of memory cells is formed;
   a second well region of the first conductivity type in which a second cell array including a plurality of memory cells is formed;
   a third well region of a second conductivity type including the first and second well regions;
   a bit line connected to the memory cells included in the first cell array and the memory cells included in the second cell array; and
   a column decoder connected to the bit line, wherein
   in an erase operation, the first well region and the third well region are set at a first voltage, and the second well region is set at a second voltage lower than the first voltage, when erasing is performed on a memory cell targeted for erasing in the first cell array, and
   a third voltage lower than the second voltage is applied to a gate of the memory cell targeted for erasing in the first cell array, and a fourth voltage lower than the second voltage and higher than the third voltage is applied to gates of the memory cells other than the memory cell targeted for erasing.

2. The nonvolatile semiconductor storage device according to claim 1, wherein
   the fourth voltage is applied to gates of the memory cells in the second cell array.

3. The nonvolatile semiconductor storage device according to claim 1, wherein
   in the erase operation, voltages of the first well region, the second well region, the third well region and the gates of the memory cells other than the memory cell targeted for erasing are discharged after the operation defined in claim 1.

4. The nonvolatile semiconductor storage device according to claim 3, wherein
   the discharge is performed to comply with a condition that the voltage of the second well region be less than or equal to the voltage of the third well region.

5. The nonvolatile semiconductor storage device according to claim 1, further comprising
   first booster circuit which charges the first well region and the third well region; and
   a second booster circuit which charges the second well region.

6. The nonvolatile semiconductor storage device according to claim 1, wherein
   the first well region and the second well region are disposed apart from each other in the third well region.

7. The nonvolatile semiconductor storage device according to claim 1, wherein
   the first and second well regions are P-type semiconductor regions, and the third well region is an N-type semiconductor region, and
   the voltage of the third well region is set to be greater than or equal to the voltages of the first and second well regions in the erase operation.

8. The nonvolatile semiconductor storage device according to claim 1, wherein
in a write operation, a drain voltage applied to a drain region of the memory cell is gradually increased to perform a plurality of writes.

9. The nonvolatile semiconductor storage device according to claim 1, wherein
in a write operation, writing is performed on the memory cell with a first write voltage,
a write verification is conducted for the memory cell to judge whether a threshold voltage of the memory cell is greater than or equal to a predetermined voltage, and
when the threshold voltage of the memory cell is lower than the predetermined voltage, writing is performed on the memory cell with a second write voltage higher than the first write voltage.

10. The nonvolatile semiconductor storage device according to claim 1, wherein
the memory cell includes a floating gate electrode, and a control gate electrode formed on the floating gate electrode.

11. The nonvolatile semiconductor storage device according to claim 1, wherein
the bit line has a first side and a second side,
the first side is connected to the memory cells and the second side is connected to a select transistor.

12. The nonvolatile semiconductor storage device according to claim 1, wherein
the bit line is directly connected to the memory cells included in the first cell array and the memory cells included in the second cell array.

13. The nonvolatile semiconductor storage device according to claim 1, wherein
the bit line is connected to each memory cell included in the first cell array and each memory cell included in the second cell array.

14. The nonvolatile semiconductor storage device according to claim 12, wherein
the bit line is directly connected to each memory cell included in the first cell array and each memory cell included in the second cell array.

* * * * *